(12) United States Patent
Takeda

(10) Patent No.: US 11,211,270 B2
(45) Date of Patent: Dec. 28, 2021

(54) PATTERN INSPECTION METHOD AND PATTERN INSPECTION APPARATUS

(71) Applicant: NUFLARE TECHNOLOGY, INC., Yokohama (JP)

(72) Inventor: Masaya Takeda, Yokohama (JP)

(73) Assignee: NUFLARE TECHNOLOGY, INC., Yokohama (JP)

(*) Notice: Subject to any disclaimer, the term of this patent is extended or adjusted under 35 U.S.C. 154(b) by 0 days.

(21) Appl. No.: 16/265,332

(22) Filed: Feb. 1, 2019

(65) Prior Publication Data

US 2019/0244844 A1 Aug. 8, 2019

(30) Foreign Application Priority Data

Feb. 5, 2018 (JP) .............................. JP2018-018275

(51) Int. Cl.
*G06T 7/00* (2017.01)
*H01L 21/67* (2006.01)
*G03F 7/20* (2006.01)
*H04N 5/225* (2006.01)

(52) U.S. Cl.
CPC ...... *H01L 21/67288* (2013.01); *G03F 7/7065* (2013.01); *G06T 7/001* (2013.01); *G06T 7/0004* (2013.01); *H04N 5/2256* (2013.01); *G06T 2207/30148* (2013.01)

(58) Field of Classification Search
CPC ... H01L 21/67288; G03F 7/7065; G03F 1/84; H04N 5/2256; G06T 7/001; G06T 2207/3014; G06T 7/0004
See application file for complete search history.

(56) References Cited

U.S. PATENT DOCUMENTS

| 7,853,067 B2 | 12/2010 | Roux |
| 8,760,642 B2 | 6/2014 | Hori et al. |
| 2005/0045914 A1* | 3/2005 | Agranat ............ H01L 21/67144 257/200 |

(Continued)

FOREIGN PATENT DOCUMENTS

| JP | 2005-85833 | 3/2005 |
| JP | 2008-112160 | 5/2008 |

(Continued)

*Primary Examiner* — Dave Czekaj
*Assistant Examiner* — Berteau Joisil
(74) *Attorney, Agent, or Firm* — Oblon, McClelland, Maier & Neustadt, L.L.P.

(57) ABSTRACT

A method according to an embodiment includes: mounting a reference-specimen of a same material as that of a specimen on a support member and creating a map indicating a distortion in a gravity direction of the reference-specimen; mounting the specimen on the support member and irradiating light to the specimen; correcting a linear component of a distortion in a gravity direction of the specimen between a first point on the specimen and a second point located in the first scanning direction on the specimen on a basis of a first difference in the gravity direction between the first and second points in the map, and correcting a secondary component of the distortion in the gravity direction of the specimen using a feedback circuit, when the pattern is imaged; and performing a defect inspection using an image of the pattern.

18 Claims, 8 Drawing Sheets

(56) References Cited

U.S. PATENT DOCUMENTS

| | | | | |
|---|---|---|---|---|
| 2008/0101684 A1* | 5/2008 | Roux | ................... | G03F 7/70483 |
| | | | | 382/145 |
| 2010/0104173 A1* | 4/2010 | Yoshida | ........... | G01N 21/95684 |
| | | | | 382/145 |
| 2019/0011557 A1* | 1/2019 | Weber | ...................... | G02B 7/08 |

FOREIGN PATENT DOCUMENTS

| | | | | |
|---|---|---|---|---|
| JP | 2010-134433 | 6/2010 | | |
| JP | 2012-129035 | 7/2012 | | |
| JP | 2012-191476 | 10/2012 | | |
| JP | 2012-237687 | 12/2012 | | |
| JP | 2015-62054 | 4/2015 | | |
| JP | 2015062054 A * | 4/2015 | ............... | G03F 1/42 |
| JP | 2016-151733 | 8/2016 | | |

\* cited by examiner

PATTERN INSPECTION METHOD AND PATTERN INSPECTION APPARATUS

CROSS REFERENCE TO RELATED APPLICATIONS

This application is based upon and claims the benefit of priority from the prior Japanese Patent Application No. 2018-018275, filed on Feb. 5, 2018, the entire contents of which are incorporated herein by reference.

FIELD

The embodiments of the present invention relate to a pattern inspection method and a pattern inspection apparatus.

BACKGROUND

In recent years, a circuit line width required for semiconductor elements has been more and more narrowed with increase in the density and increase in the capacity of a large-scale integration circuit (LSI). These semiconductor elements are manufactured through circuit formation by exposing or transferring a pattern onto a wafer with a reduced projection exposure device so-called "stepper" using an original image pattern (also "mask" or "reticle", hereinafter collectively "mask") that has a circuit pattern formed thereon. Therefore, a pattern drawing device using an electron beam that can draw a fine circuit pattern is used to manufacture a mask for transferring a fine circuit pattern onto a wafer. A pattern circuit is sometimes drawn directly on a wafer using such a pattern drawing device. Alternatively, development of a laser-beam drawing device that draws a pattern using a laser beam rather than an electron beam or a nanoimprint technology of pressing a pattern of a template against a wafer to be transferred thereon is being attempted.

Enhancement of the yield rate is essential to manufacturing of an LSI that involves a considerable manufacturing cost. However, the pattern constituting an LSI has changed from that of the sub-micron order to that of the nanometer order. A pattern defect of a mask to be used when an ultrafine pattern is exposed or transferred onto a semiconductor wafer using a photolithography technique is one of major factors that reduce the yield rate. In recent years, the dimension of a pattern defect to be detected has also become quite small with downscaling of the dimension of an LSI pattern formed on a semiconductor wafer. Accordingly, increase in the accuracy of a pattern inspection apparatus that inspects a defect on a transfer mask to be used for LSI manufacturing is required.

As an inspection method, there is a known method of performing an inspection by comparing an optical image obtained by imaging a pattern formed on a specimen such as a mask using an enlargement optical system at a predetermined magnification with design data or an optical image obtained by imaging the same pattern on the specimen. For example, as a pattern inspection method, there are a "die to die (die-die) inspection" of comparing optical image data obtained by imaging the same patterns at different places on the same mask with each other, and a "die to database (die-database) inspection" of inputting drawing data (design pattern data) obtained by converting CAD (Computer-Aided Design) data of a pattern design to data of a device input format that is input by a drawing device when a pattern is drawn on a mask to an inspection apparatus, generating a design image (a reference image) based on the data, and comparing the reference image with an optical image of a pattern. In the inspection method performed by such an inspection apparatus, a specimen is mounted on a stage, and the specimen is scanned with light flux along with movement of the stage to perform an inspection. The light flux is irradiated to the specimen by a light source and an illumination optical system. Light having transmitted through or reflected from the specimen forms an image on a sensor via an optical system. The image taken by the sensor is sent to a comparison circuit as measurement data. After aligning images with each other, the comparison circuit compares the measurement data and the reference data according to an appropriate algorithm. When the measurement data and the reference data do not match, it is determined that there is a patter defect.

In this pattern inspection apparatus, an image of a pattern formed on the surface of a mask needs to be acquired in a state where the surface of the mask is accurately aligned in an imaging plane of an objective lens. An autofocus function by a slit-projection mask-plane-position measurement device is used to align the surface of the mask with the imaging plane.

During an inspection, the mask is supported on the stage at three or more support points and is sometimes distorted due to the self-weight. This gravitational distortion causes misfocusing during imaging. Therefore, the pattern inspection apparatus corrects the position of the mask in a vertical direction (a Z direction) using the autofocus function.

However, when the inspection speed is increased and the imaging speed becomes faster, the operating speed of a feedback also needs to be faster. The acceleration of the feedback operation is costly and adversely increases the entire cost of the pattern inspection apparatus.

SUMMARY

A pattern inspection method according to an embodiment uses a pattern inspection apparatus comprising a support member configured to support a specimen, an optical system configured to irradiate light from a light source to the specimen, an imaging sensor configured to image a pattern formed on the specimen while relatively moving the specimen in a first scanning direction, an inspection part configured to perform a defect inspection using an image of the pattern, and a feedback circuit configured to correct a position in a gravity direction of the specimen using autofocusing when the pattern is imaged, the method includes:

mounting a reference specimen of a same material as that of the specimen on the support member and creating a map indicating a distortion in a gravity direction of the reference specimen;

mounting the specimen on the support member and irradiating light from the light source to the specimen;

correcting a linear component of a distortion in a gravity direction of the specimen between a first point on the specimen and a second point located in the first scanning direction on the specimen on a basis of a first difference in the gravity direction between the first point and the second point in the map, and correcting at least a secondary component of the distortion in the gravity direction of the specimen using the feedback circuit, when the pattern is imaged while a position of the specimen with respect to light from the light source is relatively moved in the first scanning direction; and performing a defect inspection using an image of the pattern.

The support member may be moved in a gravity direction to cause a stripe in a surface of the specimen to be substantially horizontal when the pattern is imaged.

The imaging sensor may image the pattern with respect to each of stripes obtained by virtually dividing the specimen in a reed shape when imaging the pattern, and a linear component of a distortion in a gravity direction of the specimen may be corrected with respect to each of the stripes.

The linear component of a distortion in a gravity direction of the specimen may be corrected with respect to each plurality of the stripes.

The imaging sensor may image the pattern with respect to each of stripes obtained by virtually dividing the specimen in a reed shape when imaging the pattern, a linear component of a distortion in a gravity direction of the specimen may be corrected using a current correction value for a stripe imaged last time when an error between the current correction value and the first difference in a stripe imaged next is smaller than a predetermined threshold, and a linear component of a distortion in a gravity direction of the specimen may be corrected using the first difference when an error between the current correction value and the first difference is equal to or larger than the threshold.

The current correction value may be updated with the first difference and a linear component of a distortion in a gravity direction of the specimen may be corrected using the current correction value having been updated when an error between the current correction value and the first difference is equal to or larger than the threshold.

The linear component of a distortion in a gravity direction of the specimen may be corrected when the distortion in the gravity direction of the specimen is larger than a threshold.

The first point may be one end of each of the stripes and the second point may be another end of the corresponding stripe.

The first point may be a highest point in a gravity direction of each of the stripes of the specimen, and the second point may be a lowest point in the gravity direction of the corresponding stripe of the specimen.

The support member may support the specimen at three positions from below in a gravity direction.

A pattern inspection apparatus according to an embodiments includes:

a support member configured to support a specimen;

an optical system configured to irradiate light from a light source to the specimen;

an imaging sensor configured to image a pattern formed on the specimen while relatively moving the specimen in a first scanning direction;

an inspection part configured to perform a defect inspection using an image of the pattern;

a feedback circuit configured to correct a position in a gravity direction of the specimen using autofocusing when the pattern is imaged;

a storage part configured to store therein a map indicating a distortion in a gravity direction of a reference specimen of a same material as that of the specimen; and a controller configured to correct a linear component of a distortion in a gravity direction of the specimen between a first point and a second point on a surface of the specimen on a basis of a first difference in the gravity direction between the first point and the second point in the map and to correct at least a secondary component of the distortion in the gravity direction of the specimen using the feedback circuit, when the pattern is imaged while a position of the imaging sensor with respect to the specimen is moved from a position corresponding to the first point to that corresponding to the second point.

DETAILED DESCRIPTION

Figure 1:
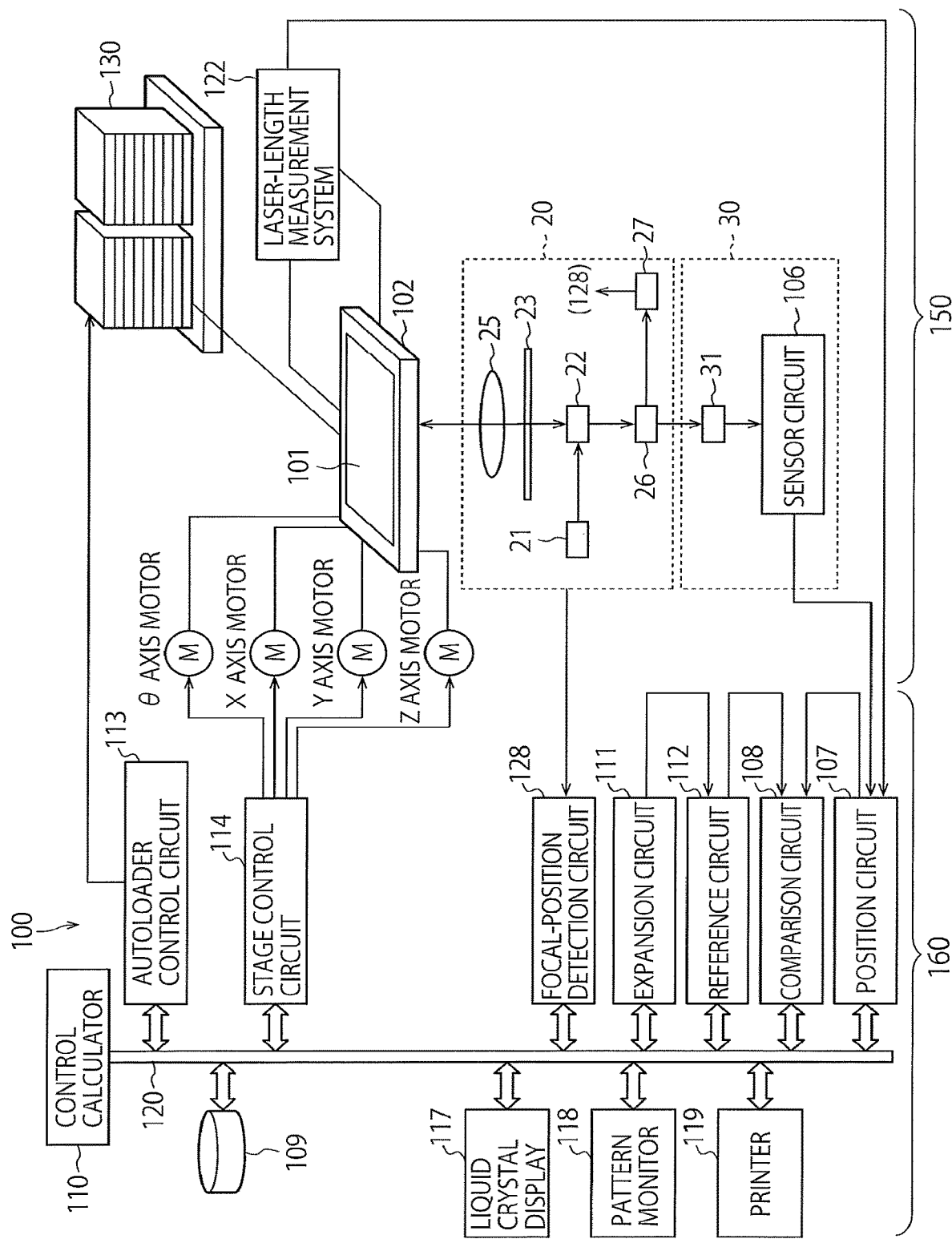
FIG. 1 is a configuration diagram illustrating an example of a pattern inspection apparatus in a first embodiment.

Embodiments will now be explained with reference to the accompanying drawings. The present invention is not limited to the embodiments. The drawings are schematic or conceptual, and the ratios and the like among respective parts are not necessarily the same as those of actual products. In the present specification and the drawings, elements identical to those described in the foregoing drawings are denoted by like reference characters and detailed explanations thereof are omitted as appropriate.

First Embodiment

FIG. 1 is a configuration diagram illustrating an example of a pattern inspection apparatus in a first embodiment. An inspection apparatus 100 includes an optical-image acquisition part 150 that inspects a defect on a pattern formed on a specimen 101, and a control system circuit 160.

The optical-image acquisition part 150 includes an optical system 20, an imaging part 30, a stage 102, an imaging sensor 31 (an example of the imaging part 30), a sensor circuit 106, a laser-length measurement system 122, and an autoloader 130.

The stage 102 serving as a support member on which the specimen 101 is mounted includes an XY stage (210 in FIG. 3) movable in a horizontal direction (an X direction and a Y direction) and a Z stage (220 in FIG. 3) movable in a vertical direction (a Z direction). The XY stage is movable also in a rotation direction (a θ direction). The XY stage can be an air slider driven by a stage control circuit 114 under control of a control calculator 110. The XY stage and the Z stage (hereinafter, also "XYZ stage") can be moved by a driving system such as four axis motors that are driven in the θ direction, the X direction, the Y direction, and the Z direction. For example, liner motors or step motors can be used as the θ motor, the X motor, the Y motor, and the Z motor. A movement position of the specimen 101 placed on the XYZ stage is measured by the laser-length measurement system 122 and is transferred to a position circuit 107.

The specimen 101 is placed on the XYZ stage and the specimen 101 moves with the XYZ stage. The specimen 101 includes, for example, an exposure photomask for transferring a pattern onto a wafer or a template used in a NIL (Nano-Imprint Lithography) technology. A pattern composed of a plurality of graphics as an inspection target is formed on a photomask or a template. The specimen 101 is placed on the XYZ stage, for example, with a pattern formation surface down. By moving the XY stage in the X direction and the Y direction within a substantially horizontal plane, the specimen 101 on the XY stage can be relatively scanned with light from the optical system 20.

The optical system 20 includes a light source 21, a polarizing beam splitter 22, a half-wave plate 23, an objective lens 25, a beam splitter 26, and an autofocus part 27. The light source 21 generates light to be irradiated to the specimen 101. The polarizing beam splitter 22 reflects the light from the light source 21 toward the specimen 101 and transmits reflection light reflected from the specimen 101 to the imaging part 30. The half-wave plate 23 applies a phase difference to a polarization plane of the light from the specimen 101. The light having passed through the half-wave plate 23 is focused on the specimen 101 and is irradiated to the specimen 101. Light having reflected on the specimen 101 passes through the objective lens 25, the half-wave plate 23, the polarizing beam splitter 22, and the beam splitter 26 to be received by the imaging part 30. A part of the light travels from the beam splitter 26 to the autofocus part 27 and is received by the autofocus part 27. The autofocus part 27 measures a light intensity via a plurality of slits and outputs information of the light intensity to a focal-position detection circuit 128. The focal-position detection circuit 128 receives the information of the light intensity from the autofocus part 27, computes the ratio of the light intensities from the slits, and feeds back the light intensity ratio to the control calculator 110. The control calculator 110 controls the stage control circuit 114 on the basis of the light intensity ratio and adjusts the position of the XYZ stage to adapt the focal position of light to the surface of the specimen 101. In this way, the inspection apparatus 100 can align the focal position with the specimen 101 using the autofocus function.

The inspection apparatus 100 is a reflective inspection apparatus in which reflection light from the specimen 101 is received by the imaging part 30 to obtain an optical image. However, the inspection apparatus 100 can be a transmissive inspection apparatus in which light having transmitted through the specimen 101 is received by the imaging part 30 to obtain an optical image.

The imaging part 30 includes the sensor 31 and the sensor circuit 106 and receives the light from the specimen 101 to acquire an image of the specimen 101. The sensor 31 receives the light from the optical system 20 and converts an optical signal to an electrical signal (photoelectric conversion). The sensor 31 can be, for example, a line sensor including imaging elements such as photodiodes arrayed in a line, or an area sensor including imaging elements arranged two-dimensionally in a plane. For example, a TDI (Time Delay Integration) sensor can be used as a line sensor. The sensor 31 can be, for example, a CCD (Charge Coupled Device). The sensor circuit 106 performs A/D (Analogue-to-Digital) conversion of the electrical signal from the sensor 31 to obtain an optical image. This image is transmitted to a comparison circuit 108 via the position circuit 107 and is used for comparison processing at the time of detection of a defect on the specimen 101.

The sensor circuit 106 performs A/D conversion of the pattern image received from the sensor 31 and sends image data of the pattern image to the position circuit 107. The image data obtained by the A/D conversion is, for example, 8-bit data with no sign and represents tones of brightness of respective pixels of the sensor 31.

The autoloader 130 is driven by an autoloader control circuit 113 under control of the control calculator 110 to automatically mount the specimen 101 as an inspection target on the stage 102 and automatically carry the specimen 101 out of the stage 102 after the inspection ends. When the specimen 101 is mounted on the stage 102, light is irradiated from the optical system 20 located below the stage 102 to the pattern formed on the specimen 101. Light reflected on the specimen 101 forms an image on the sensor 31 included in the imaging part 30. The inspection apparatus 100 can have a configuration to introduce light transmitted through the specimen 101 to the sensor 31. When this configuration and the configuration illustrated in FIG. 1 are both used at the same time, optical images respectively produced by the transmission light and the reflection light can be acquired simultaneously.

In the control system circuit 160, the control calculator 110 serving as a computer is connected to the position circuit 107, the comparison circuit 108, an expansion circuit 111, a reference circuit 112, the autoloader control circuit 113, the stage control circuit 114, the focal-position detection circuit 128, a storage part 109, a display 117, a pattern monitor 118, and a printer 119 via a bus 120. The control system circuit 160 can be constituted of a single CPU (Central Processing Unit) or a plurality of CPUs.

Format data stored in the storage part 109 contains design pattern data. The design pattern data is read by the expansion circuit 111 from the storage part 109 through the control calculator 110. The expansion circuit 111 converts the design pattern data to image data (bit pattern data). The image data converted by the expansion circuit 111 is sent to the reference circuit 112 and is used for generation of a reference image. The reference image generated by the reference circuit 112 is sent to the comparison circuit 108 and is compared with an optical image of the specimen 101 as an inspection target.

Meanwhile, an optical image of the specimen 101 is imaged by the sensor 31, is subjected to the A/D conversion, and is sent to the position circuit 107 in the manner described above. In order to obtain an optical image suitable for an inspection, it is important to accurately detect the focal position of the light irradiated to the specimen 101 and perform focusing. The autofocus function is used to align the surface of the specimen 101 (a surface on which the pattern is formed: hereinafter, also "pattern surface") with the focal position of the optical system 20.

The control calculator 110 controls the stage control circuit 114 on the basis of the information from the focal-position detection circuit 128 to move the Z stage in the Z direction (a height direction) in such a manner that the detected focal position is located on the pattern surface of the specimen 101 as described above. This adjusts the pattern surface of the specimen 101 to be aligned with the focal position. The adjustment of the focal position is performed by relatively moving the position of the pattern surface of the specimen 101 and the focal position. Therefore, while the adjustment of the focal position can be performed by moving the focal position itself, the adjustment can be performed by moving the Z stage as in the present embodiment.

Figure 2:
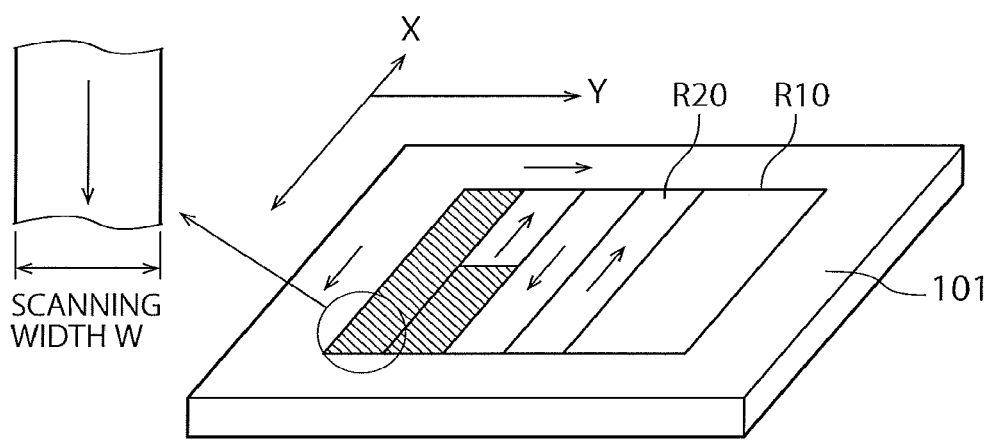
FIG. 2 is a conceptual diagram illustrating imaging of an inspection region.

When the pattern surface of the specimen 101 is aligned with the focal position of the optical system 20, the sensor 31 takes an optical image of the pattern of the specimen 101. Practically, the sensor 31 images the pattern of the specimen 101 sequentially with respect to each of stripes as illustrated in FIG. 2. Therefore, determination of reliability of the autofocus function is performed nearly in real time immediately before imaging of the pattern. The optical image is subjected to A/D conversion by the sensor circuit 106 and is sent to the comparison circuit 108 with the data indicating the position of the specimen 101 on the stage 102 and output from the position circuit 107.

The comparison circuit 108 compares the optical image data and the reference image data with each other using an appropriate comparison determination algorithm as described above. When a result of the comparison indicates that a difference between both data is above a predetermined threshold, that place is determined as a defect.

FIG. 1 illustrates constituent parts necessary for explanation of the first embodiment. It goes without saying that other constituent parts generally required for the inspection apparatus 100 can be included. Respective circuits in the sensor circuit 106, the autoloader control circuit 113, the stage control circuit 114, the focal-position detection circuit 128, the expansion circuit 111, the reference circuit 112, the comparison circuit 108, and the position circuit 107 can be constituted of electrical circuits or can be realized as software that can be operated by a computer such as the control calculator 110. These circuits can be implemented by a combination of hardware and software or a combination with firmware.

FIG. 2 is a conceptual diagram illustrating imaging of an inspection region. An inspection region R10 of the specimen 101 is, for example, virtually divided into a plurality of inspection stripes R20 of a reed shape having a scanning width W in the Y direction. The inspection apparatus 100 acquires an image (a stripe region image) of each of the inspection stripes R20. Laser light is used to each of the inspection stripes R20 to take an image of a pattern formed in the relevant stripe region in a longitudinal direction (the X direction) of the stripe region. The sensor 31 acquires an optical image while continuously relatively moving in the X direction with movement of the XY stage. The sensor 31 sequentially takes optical images with the scanning width W as illustrated in FIG. 2. In other words, the sensor 31 takes an optical image of the pattern formed on the specimen 101 using inspection light while moving relatively to the XY stage. In the present embodiment, after taking an optical image of one inspection stripe (first stripe) R20, the sensor 31 moves to the position of the next inspection stripe (second stripe) R20 in the Y direction and then continuously takes an optical image with the scanning width W in the same manner while moving in the reverse direction. That is, imaging is repeated in a forward (FWD)-backward (BWD) direction where the direction of an outward path and the direction of a return path are opposite to each other. For example, the image of the first stripe corresponds to an image acquired in an outward path of the XY stage and the image of the second stripe corresponds to an image acquired in a return path of the XY stage. The image of the first stripe can correspond to an image acquired in a return path of the XY stage and the image of the second stripe can correspond to an image acquired in an outward path of the XY stage.

Figure 4:
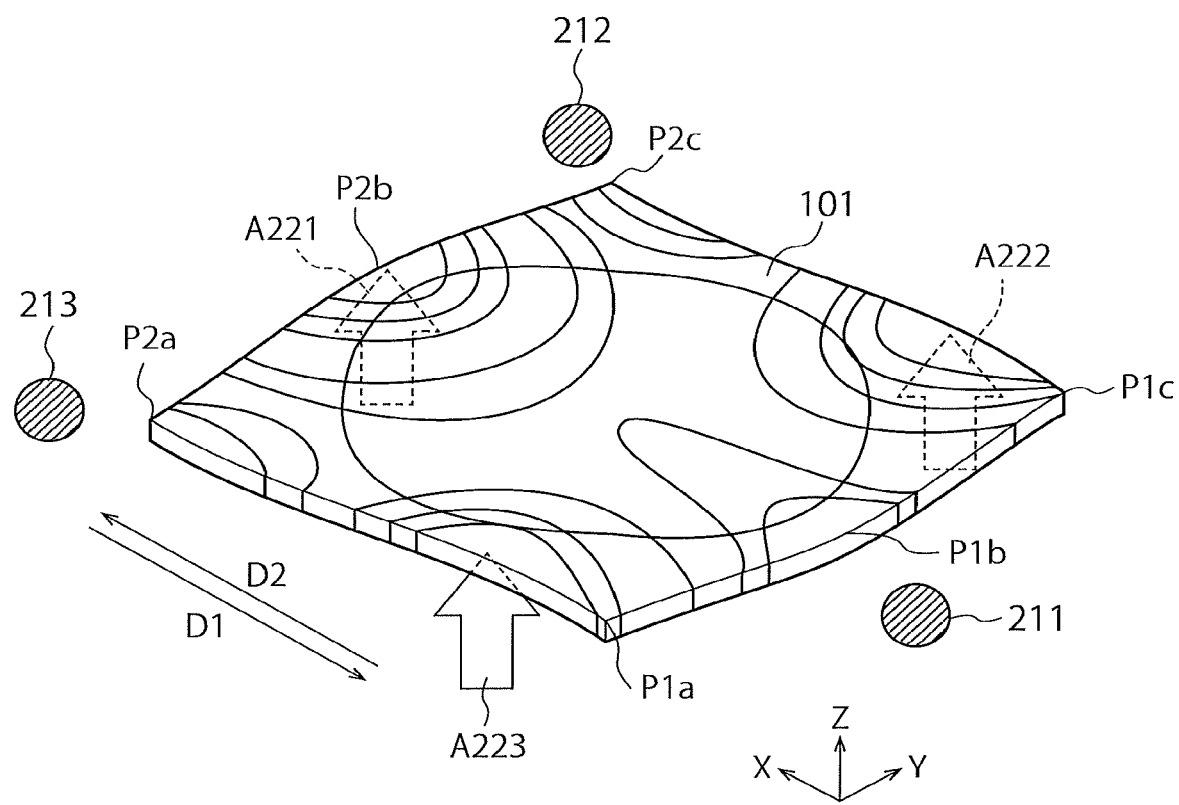
FIG. 4 is a perspective view illustrating a distortion of the specimen on the Z stage.

As described above, at the time of imaging the pattern, the sensor 31 alternately acquires, for example, images of first stripes taken while relatively moving in a direction D1 in FIG. 4 and images of second stripes taken while relatively moving in a direction D2 opposite to the direction D1. This enables the sensor 31 to image the entire pattern surface of the specimen 101.

The direction of the imaging is not limited to repetition of forward (FWD)-backward (BWD) and the imaging can be performed in one direction. For example, the imaging can be performed by repetition of FWD-FWD. Alternatively, the imaging can be performed by repetition of BWD-BWD.

In this way, the imaging part 30 acquires an image of the pattern on the specimen 101 while the specimen 101 is scanned with the light from the optical system 20.

The configuration of the stage 102 is explained below in more detail.

Figure 3A:
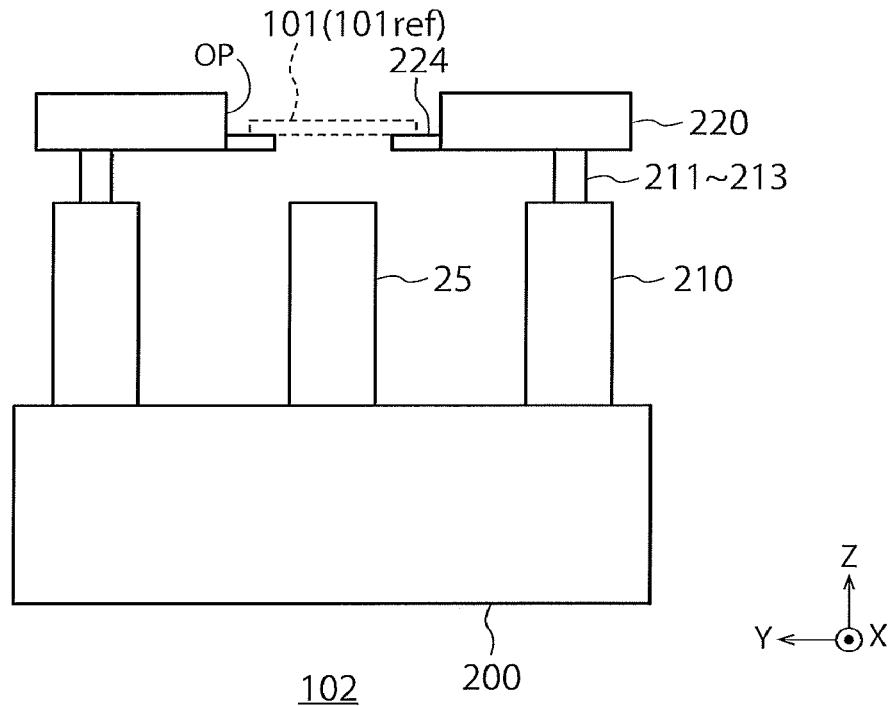
FIGS. 3A and 3B are front and plan views illustrating an example of the configuration of the stage 102.
Figure 3B:
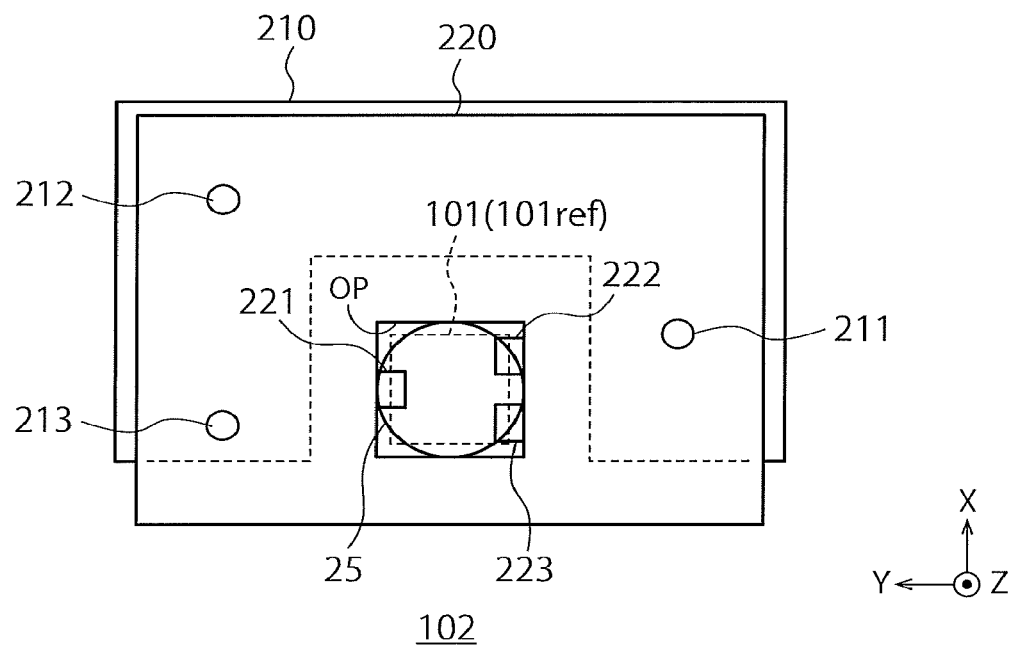

FIGS. 3A and 3B are front and plan views illustrating an example of the configuration of the stage 102, respectively. As illustrated in FIG. 3A, the stage 102 includes a surface plate 200, the XY stage 210, and the Z stage 220. The surface plate 200 is fixed substantially horizontally to the body of the inspection apparatus 100. The XY stage 210 is provided on the surface plate 200.

The XY stage 210 can move substantially in parallel to a substantially-horizontal surface (an XY plane) of the surface plate 200. The XY stage 210 has three support shafts 211 to 213 as illustrated in FIG. 3B. Each of the support shafts 211 to 213 is extendable in a substantially vertical direction (Z direction). The Z stage 220 is provided on the support shafts 211 to 213 of the XY stage 210.

The Z stage 220 can be moved in the substantially vertical direction (Z direction) by an extending operation of the support shafts 211 to 213 of the XY stage 210. The support shafts 211 to 213 can extend by the same amounts, respectively, to move the Z stage 220 in parallel to the XY plane. Only one or two of the support shafts 211 to 213 can extend to incline the Z stage 220 with respect to the XY plane.

The Z stage 220 has an opening OP as illustrated in FIG. 3A. The opening OP is provided above the objective lens 25 to enable light from the objective lens 25 to be irradiated to the specimen 101. That is, as illustrated in FIG. 3B, the opening OP is provided to overlap with the objective lens 25 and the specimen 101 when viewed from above in the Z direction. The opening OP is substantially similar to the outline of the specimen 101 and is slightly larger than the specimen 101. The Z stage 220 has three support parts 221 to 223 on an internal side surface of the opening OP and supports the specimen 101 from vertically below. The specimen 101 is adsorptively immobilized on the support parts 221 to 223 and can move within the XY plane according to an operation of the XY stage 210 and move in the Z direction according to an operation of the Z stage 220. The objective lens 25 is provided right below the specimen 101 and light from the objective lens 25 is irradiated to the specimen 101. In FIGS. 3A and 3B, the specimen 101 is indicated with a broken line.

The specimen 101 is supported at three positions by the support parts 221 to 223 within the opening OP. Other part of the specimen 101 than contact portions with the support parts 221 to 223 is in a floating state due to the opening OP as illustrated in FIG. 3A. Therefore, the specimen 101 has slightly different height positions in the Z direction between support regions supported by the support parts 221 to 223 and a floating region other than the support regions due to the self-weight, and has a distortion in the Z direction.

FIG. 4 is a perspective view illustrating a distortion of the specimen 101 on the Z stage 220. In FIG. 4, the distortion of the specimen 101 is drawn in a manner easy to understand. Arrows A221, A222, and A223 denote places supported by the support parts 221 to 223 on the bottom surface of the specimen 101, respectively. With the support of the support parts 221 to 223, the places of the specimen 101 denoted by the arrows A221, A222, and A223 are located at relatively high positions. Meanwhile, the specimen 101 falls vertically downward (in a −Z direction) due to the self-weight to cause a distortion as the distance from the places denoted by the arrows A221, A222, and A223 is increased.

Such a distortion of the specimen 101 leads to a deviation of the focal position of the light from the objective lens 25. The focal position can generally be corrected by a feedback circuit using the autofocus part 27, the focal-position detection circuit 128, the stage control circuit 114, motors M, and the stage 102. However, as described above, when the imaging speed of the imaging part 30 (that is, the scanning speed) is increased, increase in the operating speed of the feedback is required to follow the increased imaging speed. The acceleration of the feedback operation requires increase in an operation speed of the feedback circuit and weight reduction of the object controlled on the stage 102. Accordingly, the cost of the pattern inspection apparatus inevitably increases. On the other hand, a feedback circuit that is inexpensive and has a low speed cannot follow the imaging speed and the imaging part 30 performs imaging in a state where the focal position is deviated from the pattern surface of the specimen 101 due to the distortion of the specimen 101. This prevents the inspection apparatus 100 from accurately inspecting a defect of the pattern.

In order to solve this problem, the inspection apparatus 100 according to the present embodiment previously creates a map (hereinafter, also "distortion map") indicating a distortion in the gravity direction (the Z direction) of the specimen 101 using a reference mask, and corrects a linear component (that is, a primary component) of the distortion in the gravity direction of the specimen 101 on the basis of the distortion map. Secondary and higher-order components of the distortion of the specimen 101 are corrected using the feedback circuit (27, 128, 114, M, and 102). Accordingly, while the pattern surface is scanned with the light from the optical system 20, the position of the specimen 101 in the Z direction is controlled so as to cause a part of the pattern surface irradiated with the light to have substantially uniform heights. That is, while the position of the specimen 101 in the Z direction is controlled so as to cancel the distortion in the Z direction of the specimen 101, the pattern surface of the specimen 101 is scanned with the light from the optical system 20. Because the linear component of the distortion is already corrected on the basis of the distortion map in the present embodiment, feedback control of the secondary and higher-order components can be performed using the autofocus function. Therefore, even a low-speed feedback circuit can follow the imaging speed of the pattern surface.

A pattern inspection method according to the present embodiment is explained below in more detail.

Figure 5A:
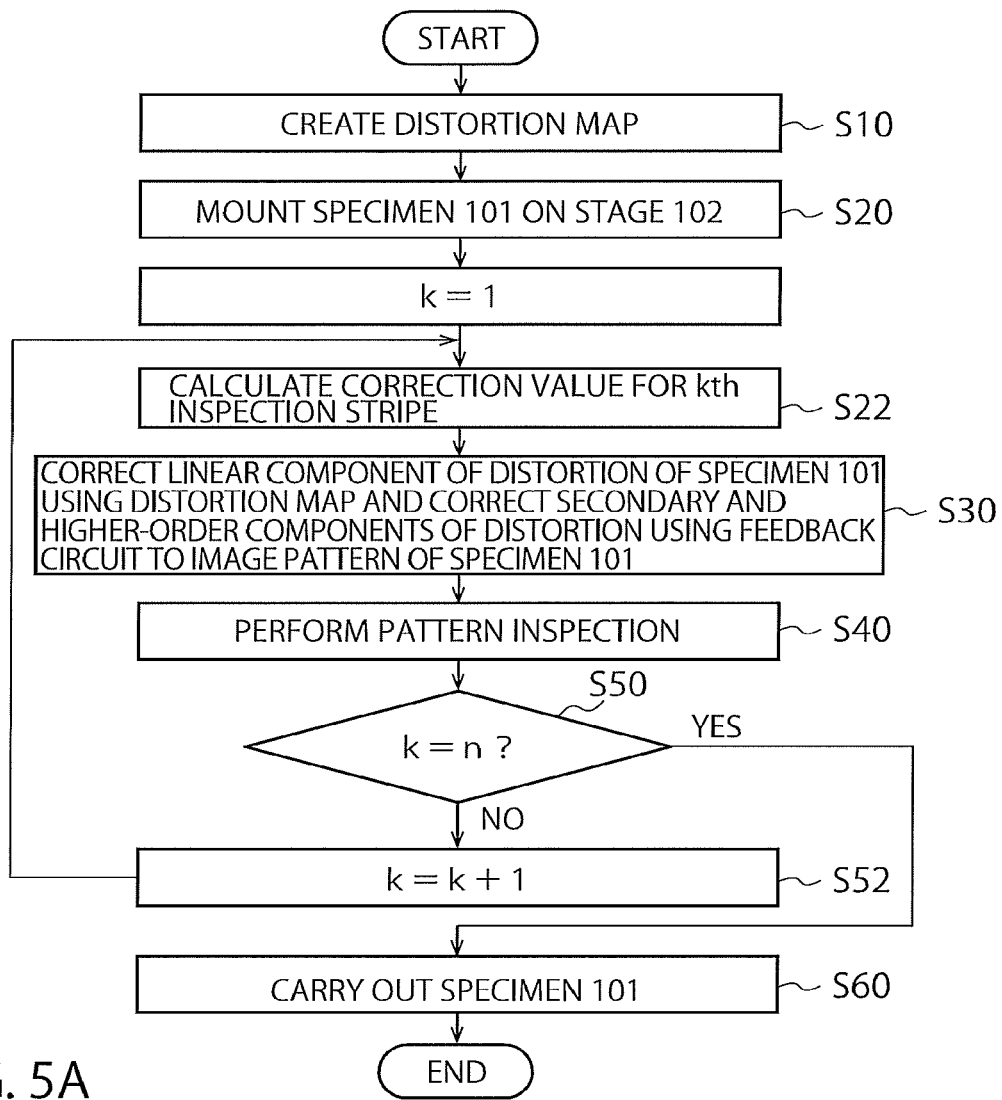
FIGS. 5A and 5B are flowcharts illustrating an example of the pattern inspection method according to the first embodiment.
Figure 5B:
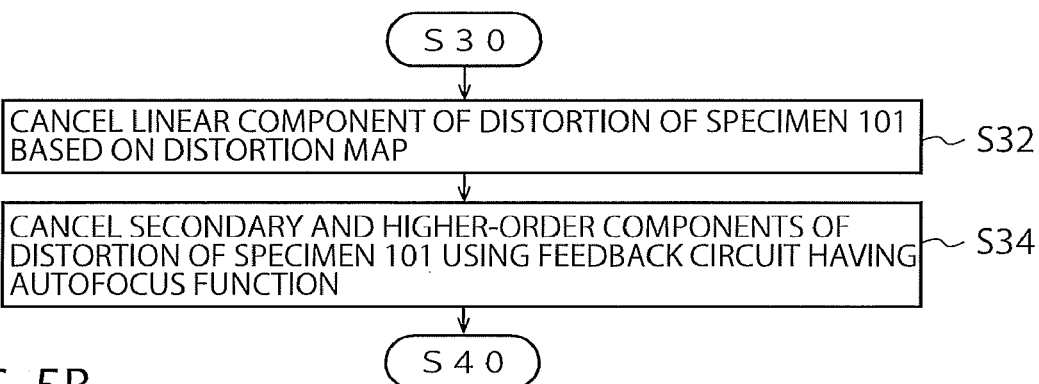

FIGS. 5A and 5B are flowcharts illustrating an example of the pattern inspection method according to the first embodiment.

(Creation of Distortion Map)

First, a distortion map is previously created using a reference specimen (Step S10). The reference specimen is a specimen of the same material and the same size as those of the specimen 101 as an inspection target and can be considered as the specimen 101 before formation of a pattern. In order to distinguish the reference specimen from the specimen 101, the reference specimen is hereinafter denoted by 101ref. The reference specimen 101ref is mounted on the stage 102 and is irradiated with light from the optical system 20 similarly to the specimen 101 illustrated in FIGS. 3A and 3B. The surface of the reference specimen 101ref is scanned with light in the manner as described with reference to FIG. 2. At this time, the surface of the reference specimen 101ref is scanned with light while the focal position is aligned with the surface of the reference specimen 101ref using the autofocus function. The position in the Z direction (the height) of the Z stage 220 at a time when the focal position is aligned with the surface of the reference specimen 101ref is stored in the storage part 109. When the height of the Z stage 220 is stored in the storage part 109 for the entire surface of the reference specimen 101ref, a distortion map indicating a distortion in the gravity direction of the reference specimen 101ref is completed.

Because the reference specimen 101ref is of the same material, the same size, and the same thickness as those of the specimen 101, a distortion occurring in the specimen 101 when the specimen 101 is mounted on the stage 102 can be substantially reproduced. This distortion map of the reference specimen 101ref can be regarded as indicating the distortion of the specimen 101. At the time of creation of the distortion map, the surface of the specimen 101ref is scanned with light at a speed that can be sufficiently followed by the feedback circuit. That is, because focusing is performed using the autofocus function, the creation speed of the distortion map using the reference specimen 101ref is lower than the inspection speed of the specimen 101. However, this enables the distortion map to have information of the distortion of the specimen 101 almost accurately. The distortion map can be stored in the storage part 109 or can be managed outside the inspection apparatus 100. The distortion map can be used commonly for a plurality of specimens 101 as long as the specimens 101 are the same as the reference specimen 101ref.

(Pattern Inspection)

After the reference specimen 101ref is removed from the stage 102, the method proceeds to an inspection of the pattern on the specimen 101. In the inspection of the pattern, the specimen 101 is first mounted on the stage 102 (Step S20).

Next, as explained with reference to FIG. 2, the XYZ stage 210, 220 is moved while the light from the optical system 20 is irradiated to the specimen 101, and the imaging part 30 images the pattern on the specimen 101 with respect to each of the inspection stripes R20. For example, numbers 1 to n (n is an integer equal to or larger than 2 and indicates the last stripe) are respectively assigned to the inspection stripes in the inspection order. In this case, the optical system 20 scans the first inspection stripe to the nth inspection stripe with the light in the ascending order and the imaging part 30 follows the scan and images patterns on the first inspection stripe to the nth inspection stripe in the ascending order. The first and second inspection stripes can correspond to the first and second stripes described above, respectively.

The inspection apparatus 100 according to the present embodiment corrects (cancels) the linear component of the distortion in the gravity direction (the Z direction) of the specimen 101 using the distortion map described above, without using the feedback circuit, at the time of imaging of the pattern.

The control calculator 110 or the stage control circuit 114 calculates a correction value with respect to each of the inspection stripes (Step S22). For example, at the time of imaging of a kth ($1 \leq k \leq n$) inspection stripe, the control calculator 110 or the stage control circuit 114 can calculate a difference (a first difference) $\Delta Z_k$ in the height between one of ends of the kth inspection stripe in the X direction and the other end as a correction value. Alternatively, the control calculator 110 or the stage control circuit 114 can calculate a difference ΔZk between the maximum value (a highest point) in the Z direction of the kth inspection stripe and the minimum value (a lowest point) thereof as a correction value. The initial value of k is 1.

In correction of the linear component of the distortion, the control calculator 110 or the stage control circuit 114 corrects the Z stage 220 to cause a straight line connecting one of the ends of the kth inspection stripe in the X direction and the other end to be substantially parallel to an X-Y plane (substantially horizontal) (that is, to cause the difference ΔZk to be 0 (zero)). Alternatively, the control calculator 110 or the stage control circuit 114 corrects the Z stage 220 to cause a straight line connecting the maximum value in the X direction of the kth inspection stripe and the minimum value thereof to be substantially parallel to the X-Y plane (substantially horizontal) (that is, to cause the difference ΔZk to be 0).

Along with the correction of the linear component of the distortion of the specimen 101, the inspection apparatus 100 corrects (cancels) secondary and higher-order components of the distortion in the Z direction of the specimen 101 using the feedback circuit (Step S30).

Correction processing for the linear component of the distortion of the specimen 101 is explained in more detail.

Figure 6A:
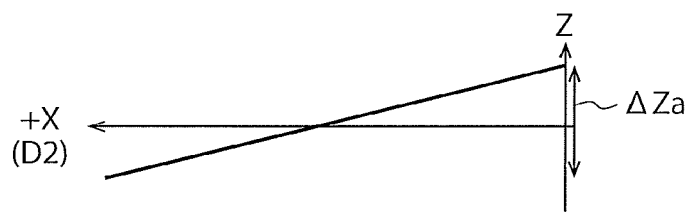
FIGS. 6A to 6C are graphs illustrating linear components of the distortion of the specimen in certain inspection stripes.
Figure 6B:
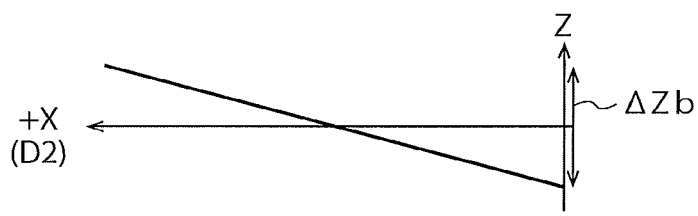
Figure 6C:
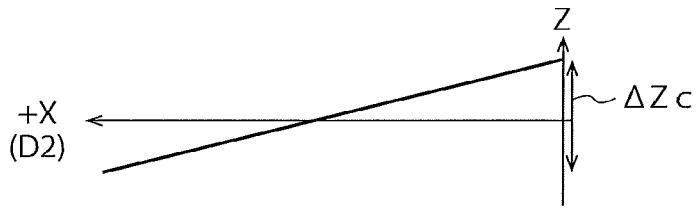

FIGS. 6A to 6C are graphs illustrating linear components of the distortion of the specimen 101 in certain inspection stripes R20, respectively. The vertical axis represents the displacement in the gravity direction (the Z direction) of the pattern surface of the specimen 101. The horizontal axis represents the position in the X direction on the inspection stripe R20.

For example, FIG. 6A illustrates a linear component of a distortion in an inspection stripe R20 located near the arrow A223 (the support part 223) in FIG. 4. Because the specimen 101 is supported at the arrow A223, the specimen 101 falls vertically downward (in the −Z direction) with an increasing distance from the arrow A223 in the +X direction (the direction D2).

For the inspection stripe near the arrow A223 in FIG. 4, the pattern is imaged while the position of the light is moved from a first point P1a on the pattern surface of the specimen 101 to a position corresponding to a second point P2a located in the direction D2.

At the time of imaging of the pattern, the stage control circuit 114 moves the Z stage 220 to correct the linear component of the distortion in the gravity direction of the specimen 101 between the first point P1a and the second point P2a by a difference (ΔZa in FIG. 6A) in the Z direction between the first point P1a and the second point P2a in the distortion map. That is, the linear component of the distortion of the specimen 101 is canceled based on the distortion map (Step S32). The first point P1a and the second point P2a can be any different two points in the inspection stripe of the specimen 101. However, to correct the linear component of the distortion more accurately, it is preferable that the first point P1a and the second point P2a are one end (an inspection start point) of an inspection stripe and the other end (an inspection end point) thereof. Alternatively, to correct the linear component of the distortion accurately, the first point P1a and the second point P2a can be the maximum value (a highest point) and the minimum value (a lowest point) in the Z direction of an inspection stripe of the specimen 101.

Correction of the linear component of the distortion can be performed by changing the lengths in the Z direction of the support shafts 211 to 213 illustrated in FIG. 3B. For example, at the time of imaging an inspection stripe near the arrow A223 in FIG. 4, the stage control circuit 114 decreases the extension length of the support shaft 211 to be shorter than those of the other support shafts 212 and 213 because the second point P2a is lower than the first point P1a. It suffices to cause the support shaft 211 to be lower than the support shafts 212 and 213 by the difference ΔZa in FIG. 6A while the inspection stripe is scanned with light from one end to the other end. This lowers the first point P1a and can correct the linear component of the distortion illustrated in FIG. 6A to be substantially horizontal. That is, the difference ΔZa is canceled.

The stage control circuit 114 can alternatively increase the extension lengths of the two support shafts 212 and 213 to be longer than that of the support shaft 211 to correct the linear component of the distortion. However, control on one support shaft 211 is more accurate and easier than control on the two support shaft 212 and 213. Therefore, it is preferable that the linear component of the distortion is corrected by control on the support shaft 211.

Meanwhile, along with the correction of the linear component by the stage control circuit 114 using the distortion map, the feedback circuit (27, 128, 114, M, and 102) having the autofocus function corrects (cancels) secondary and higher-order components of the distortion in the Z direction of the specimen 101 using the autofocus function (Step S34). At this time, the inspection apparatus 100 corrects the secondary and higher-order components of the distortion of the specimen 101 by feedback control in a state where the distortion of the linear component has been eliminated. Therefore, the feedback circuit does not require a very high speed operation. An existing control method can be applied to the feedback control. Therefore, detailed descriptions of the feedback control are omitted here.

FIG. 6B illustrates a linear component of a distortion in an inspection stripe R20 located near the arrow A221 (the support part 221) in FIG. 4. Because the specimen 101 is supported at the arrow A221, the specimen 101 falls vertically downward (in the −Z direction) with an increasing distance from the arrow A221 in the −X direction (the direction D1).

For the inspection stripe near the arrow A221 in FIG. 4, the pattern is imaged while the position of the light is moved from a first point P1b on the pattern surface of the specimen 101 to a position corresponding to a second point P2b located in the direction D2.

At the time of imaging of the pattern, the stage control circuit 114 moves the Z stage 220 to correct the linear component of the distortion in the gravity direction of the specimen 101 between the first point P1b and the second point P2b by a difference (ΔZb in FIG. 6B) in the Z direction between the first point P1b and the second point P2b in the distortion map. That is, the linear component of the distortion of the specimen 101 is canceled based on the distortion map (Step S32). The first point P1b and the second point P2b can also be any different two points in the corresponding inspection stripe. However, the first point P1b and the second point P2b can be one end (an inspection start point) and the other end (an inspection end point) of the corresponding inspection stripe, or can be the maximum value and the minimum value in the Z direction of the inspection stripe.

Correction of the linear component of the distortion can be performed by changing the lengths in the Z direction of the support shafts 211 to 213 illustrated in FIG. 3B. For example, at the time of imaging an inspection stripe near the arrow A221 in FIG. 4, the stage control circuit 114 increases the extension length of the support shaft 211 to be longer than those of the other support shafts 212 and 213 because the first point P1*b* is lower than the second point P2*b*. While the inspection stripe is scanned with light from one end to the other end, it suffices to cause the support shaft 211 to be higher than the support shafts 212 and 213 by the difference ΔZb in FIG. 6B. This causes the first point P1*b* to be higher and can correct the linear component of the distortion illustrated in FIG. 6B to be substantially horizontal. That is, the difference ΔZb is canceled.

Meanwhile, along with the correction of the linear component by the stage control circuit 114 using the distortion map, the feedback circuit (27, 128, 114, M, and 102) cancels secondary and higher-order components of the distortion in the Z direction of the specimen 101 using the autofocus function (Step S34). At this time, the inspection apparatus 100 can correct the secondary and higher-order components of the distortion of the specimen 101 by the feedback control in a state where the distortion of the linear component has been eliminated. Therefore, the feedback circuit does not require a very high speed operation.

FIG. 6C illustrates a linear component of a distortion in an inspection stripe R20 located near the arrow A222 (the support part 222) in FIG. 4. Because the specimen 101 is supported at the arrow A222, the specimen 101 falls vertically downward (in the −Z direction) with an increasing distance from the arrow A222 in the +X direction (the direction D2).

For the inspection stripe near the arrow A222 in FIG. 4, the pattern is imaged while the position of the light is moved from a first point P1*c* on the pattern surface of the specimen 101 to a position corresponding to a second point P2*c* located in the direction D2.

At the time of imaging of the pattern, the stage control circuit 114 moves the Z stage 220 to correct the linear component of the distortion in the gravity direction of the specimen 101 between the first point P1*c* and the second point P2*c* by a difference (ΔZc in FIG. 6C) in the Z direction between the first point P1*c* and the second point P2*c* in the distortion map. That is, the linear component of the distortion of the specimen 101 is canceled based on the distortion map (Step S32). The first point P1*c* and the second point P2*c* can also be any different two points in the corresponding inspection stripe. However, the first point P1*c* and the second point P2*c* can be one end (an inspection start point) and the other end (an inspection end point) of the corresponding inspection stripe, or can be the maximum value and the minimum value in the Z direction of the inspection stripe.

Correction of the linear component of the distortion can be performed by changing the lengths in the Z direction of the support shafts 211 to 213 illustrated in FIG. 3B. For example, at the time of imaging of an inspection stripe near the arrow A222 in FIG. 4, the stage control circuit 114 decreases the extension length of the support shaft 211 to be shorter than those of the other support shafts 212 and 213 because the second point P1*c* is lower than the first point P1*c*. It suffices to cause the support shaft 211 to be lower than the support shafts 212 and 213 by the difference ΔZc in FIG. 6C while the inspection stripe is scanned with light from one end to the other end. This lowers the first point P1*c* and the linear component of the distortion illustrated in FIG. 6C can be corrected to be substantially horizontal. That is, the difference ΔZc is canceled.

Meanwhile, along with correction of the linear component by the stage control circuit 114 using the distortion map, the feedback circuit (27, 128, 114, M, and 102) cancels secondary and higher-order components of the distortion in the Z direction of the specimen 101 using the autofocus function (Step S34). At this time, the inspection apparatus 100 can correct the secondary and higher-order components of the distortion of the specimen 101 by the feedback control in a state where the distortion of the linear component has been eliminated. Therefore, the feedback circuit does not require a very high speed operation. The imaging part 30 can image the pattern surface of the specimen 101 while thus correcting the distortion of the specimen 101.

The image of the pattern of the specimen 101 is transmitted to the position circuit 107 and the comparison circuit 108 and is used for an inspection of the pattern.

Inspection processing on the pattern is explained next. In an inspection of the pattern, an inspection according to the die-database method or the did-die method is performed (Step S40). An inspection method according to the die-database method is described below as an example. In the die-database method, a reference image to be compared with an optical image as an inspection target is a reference image generated from the design pattern data. In the case of the die-die method, a reference image is an optical image of another region having the same pattern as that of the inspection target. It is needless to say that the present embodiment can be applied to the die-die method.

The design pattern data is stored in the storage part 109 and is read with progression of the inspection to be sent to the expansion circuit 111. The storage part 109 can be a storage device such as an HDD (Hard Disk Drive) and an SSD (Solid State Drive).

CAD data created by a user is converted to design intermediate data of a hierarchized format. The design intermediate data includes design pattern data created for each layer and formed on a specimen. Generally, an inspection apparatus is not configured to be capable of reading design intermediate data directly. Therefore, the design intermediate data is converted for each layer to format data unique to each inspection apparatus and is then input to the inspection apparatus. The format data can be data unique to an inspection apparatus or can alternatively be data compatible to a drawing device used to draw a pattern on a specimen.

The format data having been used at the time of pattern formation of the specimen 101 is stored in the storage part 109. Graphics included in the design pattern are graphics created using a rectangle, a triangle, and the like as basic graphics. Graphic data that is information such as the coordinates at a reference position of a graphic, the lengths of the sides, a graphic code being an identifier for identifying the graphic type such as a rectangle or a triangle and that defines the shape, the size, the position, and the like of each pattern graphic is stored.

The format data stored in the storage part 109 contains the design pattern data. The design pattern data is read from the storage part 109 by the expansion circuit 111 through the control calculator 110.

The expansion circuit 111 converts the design pattern data to image data (bit pattern data). That is, the expansion circuit 111 expands the design pattern data in data of each graphic and interprets the graphic code indicating the graphic shape of the graphic data, the graphic dimension, and the like. The data is expanded in binary or multi-valued image data as a pattern arranged within squares having grids of a predetermined quantization dimension as units. An occupancy of a graphic in the design pattern with respect to each region (square) corresponding to a sensor pixel is computed and the graphic occupancy in each pixel becomes a pixel value.

The image data converted by the expansion circuit 111 is sent to the reference circuit 112 serving as a reference image generator and is used for generation of a reference image.

The optical image of the specimen 101 output from the sensor circuit 106 is sent to the comparison circuit 108 with data indicating the position of the specimen 101 on the stage 102 and output from the position circuit 107. The reference image described above is also sent to the comparison circuit 108.

At this time, the inspection stripes R20 in FIG. 2 are each divided into an appropriate size as sub-stripes. A sub-stripe clipped from the optical image and a sub-stripe clipped from the corresponding reference image are input to a comparison unit in the comparison circuit 108. Each of the input sub-stripes is further divided into rectangular small regions called "inspection frame" and comparison in units of frames is performed in the comparison unit to detect a defect. Several dozen comparison units are installed in the comparison circuit 108 to enable a plurality of inspection frames to be simultaneously processed in parallel. Each of the comparison units captures an unprocessed frame image immediately after processing of one inspection frame ends. Accordingly, many inspection frames are sequentially processed. The comparison circuit 108 compares the optical image of the specimen 101 and the reference image with each other using an appropriate comparison determination algorithm. When a difference therebetween is larger than a predetermined threshold as a result of the comparison, that place is determined to be a defect.

Until imaging and inspections on all stripes of the pattern on the specimen 101 are completed, processes at Steps S22 to S40 are repeated. For example, the control calculator 110 or the stage control circuit 114 determines whether k has reached n (Step S50). When k has not reached n (NO at Step S50), the control calculator 110 or the stage control circuit 114 increases k (that is, substitutes k+1 for k) (Step S52) and repeatedly performs the processes at Steps S22 to S50.

When k has reached n (YES at Step S50), it is determined that imaging and inspections on all the stripes of the pattern on the specimen 101 are completed. Accordingly, the inspection of the specimen 101 ends and the specimen 101 is carried out of the stage 102 (Step S60).

As described above, while correcting a linear component of a distortion of the specimen 101 using the distortion map, the inspection apparatus 100 corrects secondary and higher-order components of the distortion by feedback control using the autofocus function. Accordingly, even when the inspection speed is increased and the imaging speed of the sensor 31 becomes faster, the Z stage 220 can be corrected in the Z direction to move the pattern surface of the specimen 101 to be substantially horizontal. The feedback circuit (27, 128, 114, M, and 102) does not need to correct the linear component of the distortion of the specimen 101 and it suffices that the feedback circuit corrects the secondary and higher-order components. Therefore, the operating speed of the autofocus function or the feedback circuit does not need to be so high. Accordingly, the inspection apparatus 100 can image the pattern on the specimen 101 at a high speed while suppressing the cost.

The stage 102 supports the specimen 101 at three positions (A221 to A223) from below in the gravity direction. Therefore, the inclination of the linear component of the distortion varies according to the positions of the inspection stripes R20 in the Y direction as illustrated in FIGS. 6A to 6C. The linear component of the distortion can be corrected based on the distortion map with respect to each of the inspection stripes R20. In this case, each time the XY stage 210 is reciprocated in the direction D1 or D2 to image an inspection stripe R20, the control calculator 110 and the stage control circuit 114 correct the linear component of the distortion of the specimen 101. The number of the support parts on the specimen 101 is not limited to three and can be four or more. Also in this case, the linear component of the distortion of the specimen 101 can be obtained.

Second Embodiment

In the first embodiment, the linear component of the distortion of the specimen 101 is corrected with respect to each of the inspection stripes R20. That is, the control calculator 110 or the stage control circuit 114 calculates a correction value for each inspection stripe and adjusts the height of the Z stage 220 with the correction value. In the second embodiment, in contrast thereto, the linear component of the distortion of the specimen 101 is corrected every plural adjacent inspection stripes. That is, the correction value is the same for plural adjacent inspection stripes and is computed for plural inspection stripes.

Other operations in the second embodiment can be identical to those in the first embodiment. Therefore, also in the case of the second embodiment, the sensor 31 acquires images of the first and second stripes alternately while the XY stage 210 is reciprocated in the directions D1 and D2 similarly in the first embodiment.

Figure 7:
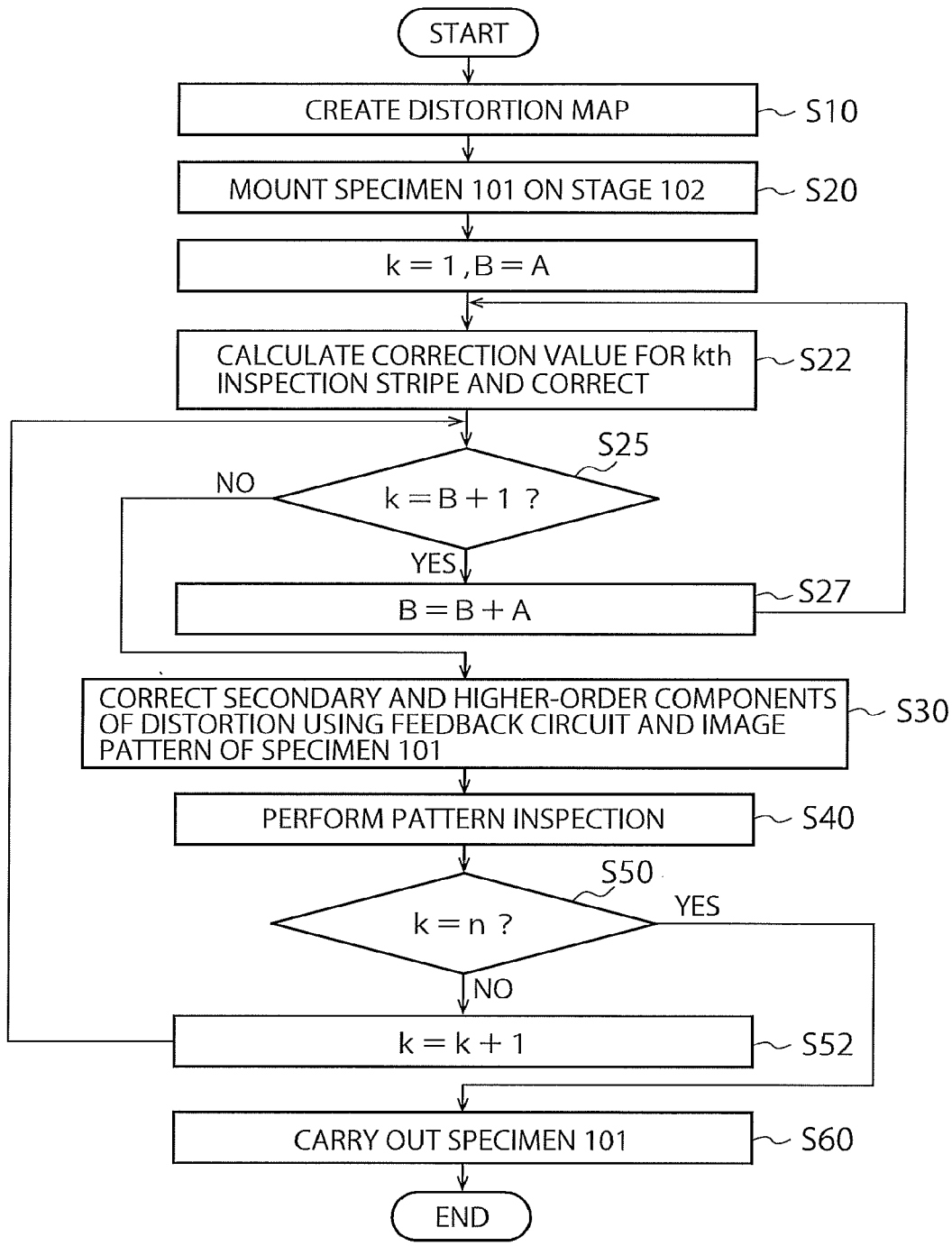
FIG. 7 is a flowchart illustrating an operation example of the inspection apparatus according to the second embodiment.

FIG. 7 is a flowchart illustrating an operation example of the inspection apparatus 100 according to the second embodiment. In FIG. 7, the control calculator 110 or the stage control circuit 114 changes the correction value every A (2≤A≤n) inspection stripes.

First, the processes at Steps S10 to S22 are performed similarly to those in the first embodiment. The initial value of k is 1. The initial value of B is A.

Next, the control calculator 110 or the stage control circuit 114 determines whether k has reached B+1 (Step S25). That is, it is determined whether k has exceeded B. When k has not reached B+1 (NO at Step S25), the processes at Steps S30 to S52 are performed.

When k has not reached n at Step S50 (NO at Step S50), the process returns to Step S25. Therefore, the processes at Steps S25 to S52 are repeatedly performed without updating the correction value until k exceeds B. That is, the correction value calculated at Step S22 is maintained until k reaches B+1.

On the other hand, when k has reached B+1 (YES at Step S25), the control calculator 110 or the stage control circuit 114 substitutes B+A for B (Step S27) and calculates the correction value for the kth inspection stripe at that time (Step S22). The correction value is thus updated. The value of B at Step S25 is reset with increase of A. Accordingly, the correction value is updated every A inspection stripe. That is, the control calculator 110 or the stage control circuit 114 corrects adjacent A inspection stripes with the same correction value and recalculates the correction value every A inspection stripe. The control calculator 110 or the stage control circuit 114 repeatedly performs the processes at Step S25 to S52 using the updated correction value.

Thereafter, the processes at Steps S22 to S52 are repeatedly performed until k reaches n. When k has reached n (YES at Step S50), the inspection of the specimen 101 ends and the specimen 101 is carried out of the stage 102 (Step S60).

When A=2 is established as a specific example, the linear component of the distortion is corrected with respect to each pair of stripes adjacent to each other. At this time, the initial value of B is 2 and the Z stage 220 is corrected with the correction value for a first inspection stripe when the first inspection stripe and a second inspection stripe are imaged.

When k has reached 3 at Step S25, B is set to B+A=4 (Step S27). The correction value for a third inspection stripe is calculated (Step S22). Therefore, when the third inspection stripe and a fourth inspection stripe are imaged, the Z stage 220 is corrected with the correction value for the third inspection stripe.

Similarly, when k has reached 5 at Step S25, B is set to B+A=6 (Step S27). The correction value for a fifth inspection stripe is calculated (Step S22). Therefore, when the fifth inspection stripe and a sixth inspection stripe are imaged, the Z stage 220 is corrected with the correction value for the fifth inspection stripe. Imaging of seventh and subsequent inspection stripes is performed in the same manner.

Correction of the secondary and higher-order components of the distortion of the specimen 101 can be performed by the feedback circuit (27, 128, 114, M, and 102) with respect to each inspection stripe in the same manner as in the embodiment described above. Furthermore, A can be 3 or more. That is, it is needless to say that the linear component of the distortion can be corrected every three or more inspection stripes.

According to the second embodiment, the same correction value is used for plural adjacent inspection stripes. Therefore, the control calculator 110 or the stage control circuit 114 does not need to calculate the correction value for each inspection stripe and load on the control calculator 110 or the stage control circuit 114 is reduced. Furthermore, because the stage control circuit 114 does not need to correct the Z stage 220 with respect to each inspection stripe, the inspection speed is higher than in a case where the Z stage 220 is corrected with respect to each inspection stripe.

Third Embodiment

According to a third embodiment, when an error between a difference (a first difference) $\Delta Zk$ in the Z direction between a first point and a second point in the distortion map of a kth inspection stripe and a current correction value $\Delta Zcrr$ is equal to or larger than a predetermined threshold, the current correction value $\Delta Zcrr$ of the linear component of the distortion of the specimen 101 is updated with $\Delta Zk$. When the error between the difference $\Delta Zk$ and the current correction value $\Delta Zcrr$ is smaller than the threshold, the control calculator 110 or the stage control circuit 114 does not update the current correction value $\Delta Zcrr$ and corrects the Z stage 220 using the current correction value $\Delta Zcrr$. The current correction value $\Delta Zcrr$ is a correction value used for an inspection stripe already imaged last time. That is, $\Delta Zcrr$ is a currently-set correction value. $\Delta Zk$ is a difference in the Z direction between a first point and a second point of the distortion map in an inspection stripe to be imaged next.

Other operations of the third embodiment can be identical to the operations of the first embodiment. Therefore, in the case of the third embodiment, similarly to the first embodiment, the sensor 31 acquires images of the first and second stripes alternately while the XY stage 210 is reciprocated in the directions D1 and D2.

Figure 8:
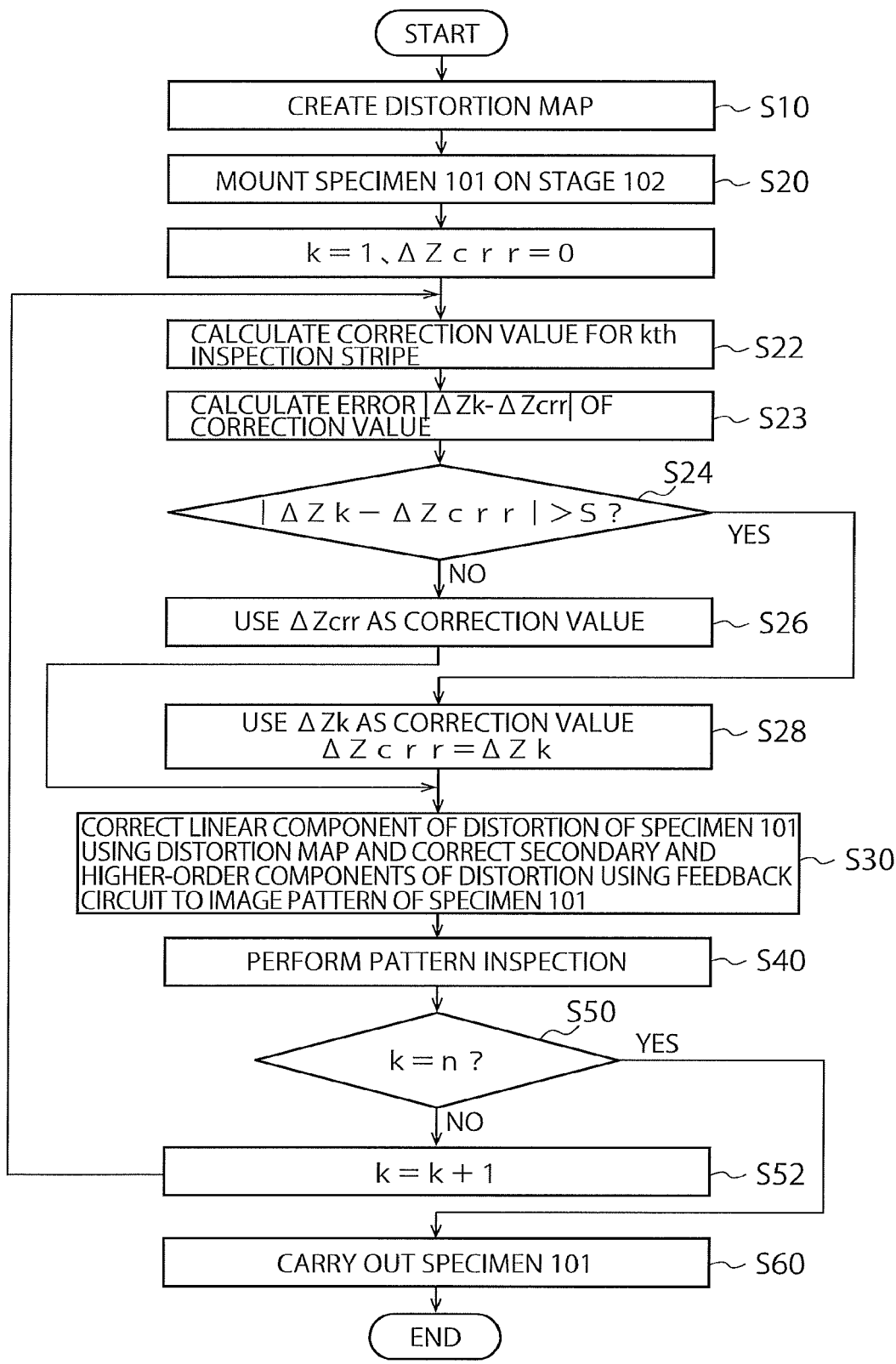
FIG. 8 is a flowchart illustrating an operation example of the inspection apparatus according to the third embodiment.

FIG. 8 is a flowchart illustrating an operation example of the inspection apparatus 100 according to the third embodiment. In FIG. 8, the control calculator 110 or the stage control circuit 114 sets the threshold to S (S is a positive number).

First, similarly to the first embodiment, the processes at Steps S10 to S22 are performed. The initial value of k is 1.

Next, the control calculator 110 or the stage control circuit 114 calculates an error $|\Delta Zk-\Delta Zcrr|$ between the difference $\Delta Zk$ of the kth inspection stripe calculated at Step S22 and the current correction value $\Delta Zcrr$ (Step S23). The initial value of $\Delta Zcrr$ is 0. Therefore, the error $|\Delta Z1-\Delta Zcrr|$ of the correction value for a first inspection stripe is $\Delta Z1$.

Subsequently, the control calculator 110 or the stage control circuit 114 determines whether the error $|\Delta Zk-\Delta Zcrr|$ of the correction value calculated at Step S23 is equal to or higher than the threshold being S (Step S24). When the error $|\Delta Zk-\Delta Zcrr|$ is smaller than the threshold S (NO at Step S24), the control calculator 110 or the stage control circuit 114 maintains the current correction value $\Delta Zcrr$ (Step S26) and performs the processes at Steps S30 to S52. When k is 1 being the initial value and $|\Delta Z1-\Delta Zcrr|$ is equal to or smaller than the threshold S, the current correction value $\Delta Zcrr$ is 0. Therefore, the height of the Z stage 220 is not corrected.

On the other hand, when the error $|\Delta Zk-\Delta Zcrr|$ of the correction value is equal to or larger than the threshold S (YES at Step S24), the control calculator 110 or the stage control circuit 114 uses a new correction value $\Delta Zk$ as the current correction value $\Delta Zcrr$ (Step S28). That is, when the difference $\Delta Zk$ in the Z direction in the distortion map is different from the current correction value $\Delta Zcrr$ having been used until that time by the threshold or a larger value, the control calculator 110 or the stage control circuit 114 updates the current correction value $\Delta Zcrr$ with the correction value $\Delta Zk$. That is, the correction value $\Delta Zk$ is substituted for the current correction value $\Delta Zcrr$.

Next, while the Z stage 220 is corrected with the correction value $\Delta Zcrr$, the inspection stripes are imaged and inspected (Steps S30 to S52).

Thereafter, the processes at Steps S22 to S52 are repeatedly performed until k reaches n. When k has reached n (YES at Step S50), the inspection of the specimen 101 ends and the specimen 101 is carried out of the stage 102 (Step S60).

When S=0.5 is established and the correction value $\Delta Z1$ for a first inspection stripe is 0.6 as a specific example, the error $|\Delta Z1-\Delta Zcrr|$ of the correction value is 0.6 and is larger than the threshold (YES at Step S24). Therefore, the current correction value $\Delta Zcrr$ is updated with $\Delta Z1$=0.6 (Step S28). The control calculator 110 or the stage control circuit 114 corrects the height of the Z stage 220 using 0.6 as the current correction value $\Delta Zcrr$ (Step S30).

Next, when the correction value for a second inspection stripe is 0.4, the error $|Z2-\Delta Zcrr|$ of the correction value is 0.2 (|0.4−0.6|) and is smaller than the threshold (NO at Step S24). Therefore, the current correction value $\Delta Zcrr$ is not updated and is maintained at 0.6. Also for the second inspection stripe, the control calculator 110 or the stage control circuit 114 corrects the height of the Z stage 220 while maintaining the current correction value $\Delta Zcrr$ at 0.6.

Next, when the correction value for a third inspection stripe is −0.1, the error $|\Delta Z3-\Delta Zcrr|$ of the correction value is 0.7 (|−0.1−0.6|) and is larger than the threshold (YES at Step S24). Therefore, the current correction value $\Delta Zcrr$ is updated with $\Delta Z3$=−0.1 (Step S28). The control calculator 110 or the stage control circuit 114 corrects the height of the Z stage 220 using −0.1 as the current correction value $\Delta Zcrr$ (Step S30). Also in imaging subsequent inspection stripes, the Z stage 220 is corrected in the same manner.

Correction of the secondary and higher-order components of the distortion of the specimen 101 can be performed by the feedback circuit (27, 128, 114, M, and 102) with respect to each inspection stripe in the same manner as in the embodiment described.

According to the third embodiment, when the error $|\Delta Zk-\Delta Zcrr|$ between the correction value $\Delta Zk$ for a kth inspection stripe and the current correction value $\Delta Zcrr$ is equal to or larger than the threshold S, the control calculator 110 or the stage control circuit 114 updates the current correction value $\Delta Zcrr$ with $\Delta Zk$. When the error $|\Delta Zk-\Delta Zcrr|$ is smaller than the threshold S, the control calculator 110 or the stage control circuit 114 uses the current correction value $\Delta Zcrr$ as it is without updating.

Therefore, the control calculator 110 or the stage control circuit 114 does not need to update the correction value with respect to each inspection stripe and load on the control calculator 110 or the stage control circuit 114 is reduced. Furthermore, because the stage control circuit 114 does not need to correct the Z stage 220 with respect to each inspection stripe, the inspection speed is increased as compared to a case where the Z stage 220 is corrected with respect to each inspection stripe.

(Modification)

When the difference (the correction value) $\Delta Za$ between the first point P1$a$ and the second point P2$a$ in each inspection stripe of the distortion map is smaller than a predetermined threshold, the inspection apparatus 100 does not perform correction of the linear component based on the distortion map. On the other hand, when the difference (the correction value) $\Delta Za$ is equal to or larger than the predetermined threshold, the inspection apparatus 100 performs correction of the linear component based on the distortion map. The inspection apparatus 100 can thus perform correction of the linear component based on the distortion map only when the correction value for each inspection stripe is equal to or larger than a predetermined threshold. Even in this modification, the effects of the present embodiment are not lost.

At least a part of the inspection method in the inspection apparatus 100 according to the present embodiment can be constituted by hardware or software. When it is constituted by software, the inspection method can be configured such that a program for realizing at least a part of the functions of the data processing method is stored in a recording medium such as a flexible disk or a CD-ROM, and the program is read and executed by a computer. The recording medium is not limited to a detachable device such as a magnetic disk or an optical disk, and can be a fixed recording medium such as a hard disk device or a memory. Further, a program for realizing at least a part of the functions of the inspection method can be distributed via a communication line (including wireless communication) such as the Internet. Furthermore, the program can be distributed in an encrypted, modulated, or compressed state via a wired communication line or a wireless communication line such as the Internet, or the program can be distributed as it is stored in a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern inspection method comprising:
   mounting a reference specimen on a support member having extendable support shafts and creating a map indicating a distortion in a gravity direction of the reference specimen;
   mounting a specimen to be inspected, which is a same material as a material of the reference specimen, on the support member and irradiating light from a light source to the specimen;
   correcting, by moving at least one of the extendable support shafts of the support member in the gravity direction, a linear component of the distortion in the gravity direction of the specimen between a first point on the specimen and a second point located in a first direction on the specimen on a basis of a first difference in the gravity direction between the first point and the second point in the map indicating the distortion of the reference specimen, and correcting, after the correction of the linear component, at least a secondary component of the distortion in the gravity direction of the specimen using a feedback circuit, when a pattern formed on the specimen is imaged by an imaging sensor while a position of the specimen with respect to light from the light source is relatively moved in the first direction; and
   performing a defect inspection using an image of the pattern.

2. The method of claim 1, wherein
   the imaging sensor images the pattern with respect to each of stripes obtained by virtually dividing the specimen in a reed shape when imaging the pattern, and
   the linear component of the distortion in the gravity direction of the specimen is corrected with respect to each stripe.

3. The method of claim 1, wherein
   the imaging sensor images the pattern with respect to each of stripes obtained by virtually dividing the specimen in a reed shape when imaging the pattern, and
   the linear component of the distortion in the gravity direction of the specimen is corrected with respect to a group of the stripes.

4. The method of claim 1, wherein
   the imaging sensor images the pattern with respect to each of stripes obtained by virtually dividing the specimen in a reed shape when imaging the pattern,
   the linear component of the distortion in the gravity direction of the specimen is corrected using a current correction value for a stripe imaged last time when an error between the current correction value and the first difference in a stripe imaged next is smaller than a threshold, and
   the linear component of the distortion in the gravity direction of the specimen is corrected using the first difference when the error between the current correction value and the first difference is equal to or larger than the threshold.

5. The method of claim 4, wherein the current correction value is updated with the first difference and the linear component of the distortion in the gravity direction of the specimen is corrected using the current correction value having been updated when the error between the current correction value and the first difference is equal to or larger than the threshold.

6. The method of claim 1, wherein the linear component of the distortion in the gravity direction of the specimen is corrected when the distortion in the gravity direction of the specimen is larger than a threshold.

7. The method of claim 1, wherein the first point is one end of each of stripes obtained by virtually dividing the specimen in a reed shape and the second point is another end of the corresponding stripe.

8. The method of claim 1, wherein
the first point is a highest point in the gravity direction of each of stripes obtained by virtually dividing the specimen in a reed shape, and
the second point is a lowest point in the gravity direction of the corresponding stripe of the specimen.

9. The method of claim 1, wherein the support member supports the specimen at three positions from below in the gravity direction.

10. A pattern inspection apparatus comprising:
a support member having extendable support shafts configured to support a specimen;
an optical system configured to irradiate light from a light source to the specimen;
an imaging sensor configured to image a pattern formed on the specimen while relatively moving the specimen in a first direction;
inspection circuitry configured to perform a defect inspection using an image of the pattern;
a feedback circuit configured to correct a position in a gravity direction of the specimen using autofocusing when the pattern is imaged;
a storage part configured to store therein a map indicating a distortion in the gravity direction of a reference specimen of a same material as that of the specimen; and
at least one central processing unit (CPU) configured to correct, by moving at least one of the extendable support shafts of the support member in the gravity direction, a linear component of the distortion in the gravity direction of the specimen between a first point and a second point on a surface of the specimen on a basis of a first difference in the gravity direction between the first point and the second point in the map indicating the distortion of the reference specimen and to correct, after the correction of the linear component, at least a secondary component of the distortion in the gravity direction of the specimen using the feedback circuit, when the pattern is imaged while a position of the imaging sensor with respect to the specimen is moved from a position corresponding to the first point to that corresponding to the second point.

11. The apparatus of claim 10, wherein
the imaging sensor images the pattern with respect to each of stripes obtained by virtually dividing the specimen in a reed shape when imaging the pattern, and
the at least one CPU corrects the linear component of the distortion in the gravity direction of the specimen with respect to each stripe.

12. The apparatus of claim 10, wherein
the imaging sensor images the pattern with respect to each of stripes obtained by virtually dividing the specimen in a reed shape when imaging the pattern, and
the at least one CPU corrects the linear component of the distortion in the gravity direction of the specimen with respect to a group of the stripes.

13. The apparatus of claim 10, wherein
the imaging sensor images the pattern with respect to each of stripes obtained by virtually dividing the specimen in a reed shape when imaging the pattern,
the at least one CPU corrects the linear component of the distortion in the gravity direction of the specimen using a current correction value for a stripe imaged last time when an error between the current correction value and the first difference in a stripe imaged next is smaller than a threshold, and
the at least one CPU corrects the linear component of the distortion in the gravity direction of the specimen using the first difference when the error between the current correction value and the first difference is equal to or larger than the threshold.

14. The apparatus of claim 13, wherein the at least one CPU updates the current correction value with the first difference and corrects the linear component of the distortion in the gravity direction of the specimen using the current correction value having been updated when the error between the current correction value and the first difference is equal to or larger than the threshold.

15. The apparatus of claim 10, wherein the at least one CPU corrects the linear component of the distortion in the gravity direction of the specimen when the distortion in the gravity direction of the specimen is larger than a threshold.

16. The apparatus of claim 10, wherein the first point is one end of each of stripes obtained by virtually dividing the specimen in a reed shape and the second point is another end of the corresponding stripe.

17. The apparatus of claim 10, wherein
the first point is a highest point in the gravity direction of each of stripes obtained by virtually dividing the specimen in a reed shape, and
the second point is a lowest point in the gravity direction of the corresponding stripe of the specimen.

18. The apparatus of claim 10, wherein the support member supports the specimen at three positions from below in the gravity direction.

* * * * *